United States Patent

Rzeznik et al.

Patent Number: 5,083,192
Date of Patent: Jan. 21, 1992

[54] CLUSTER MOUNT FOR HIGH INTENSITY LEDS

[75] Inventors: Josef Rzeznik, Conshohocken; Raymond E. Foran, Philadelphia, both of Pa.

[73] Assignee: Kulicke and Soffa Industries, Inc., Willow Grove, Pa.

[21] Appl. No.: 516,470

[22] Filed: Apr. 30, 1990

[51] Int. Cl.[5] ............... H01L 23/14; H01L 23/04
[52] U.S. Cl. .................................. 357/74; 357/17; 357/19; 357/30
[58] Field of Search .............. 357/17, 19, 30, 74; 340/782; 439/541; 313/500

[56] References Cited

U.S. PATENT DOCUMENTS

| | | | |
|---|---|---|---|
| 3,660,713 | 5/1972 | Leslie et al. | 439/541 |
| 4,307,935 | 12/1981 | Monnier | 357/17 |
| 4,672,258 | 6/1987 | Konishi | 313/500 |
| 4,742,432 | 5/1988 | Thillays et al. | 313/500 |
| 4,797,715 | 1/1989 | Thillays et al. | 357/17 |
| 4,851,824 | 7/1989 | Murata | 340/782 |
| 4,879,250 | 11/1989 | Chan | 357/19 |
| 4,907,044 | 3/1990 | Schellhorn et al. | 357/74 |
| 4,935,665 | 6/1990 | Murata | 313/500 |

Primary Examiner—Andrew J. James
Assistant Examiner—S. V. Clark
Attorney, Agent, or Firm—John B. Sowell

[57] ABSTRACT

A light concentrating cluster mount for super bright light emitting diodes is provided. The cluster mount is provided with a plurality of LED receivers therein. Said cluster mount has a central axis and each of the LED receivers has a focus axis displaced from the central axis and is focused to cross the central axis at a predetermined distance from the cluster mount so that the side light and the frontal light emitted from each of the light emitting diodes is refocused on to area to be illuminated at a predetermined distance from the cluster mount.

7 Claims, 3 Drawing Sheets

CLUSTER MOUNT FOR HIGH INTENSITY LEDS

BACKGROUND OF THE INVENTION

1. Field of the Invention

The present invention relates to light sources of the type employed to illuminate semiconductors during the process of manufacturer. More particularly, the present invention relates to a cluster mount for concentrating light being emitted from a plurality of high intensity light emitting diodes (LEDs).

2. Description of the Prior Art

Heretofore illuminators for semiconducting manufacturing equipment have employed fluorescent or incandescent white light which may be supplied directly or though lucite tubes or fiber optic bundles. While such white light sources have been able to be flood a focus white light on the semiconductor chips being processed, the light and/or the light source has consumed excesses or mounts of power and generated heat in the workplace.

Experiments using light emitting diodes as light illumination sources have resulted in highly mixed results. Light from light emitting diodes has a narrow wave length varying from various reds in the long wave length spectrum to greens associated with the short wave lengths and narrow spectrum intensity characteristics.

The human eye is more responsive to a broad spectrum of colors which define white light. However, electronic pattern recognition systems have been found to be responsive to narrow spectrum wave lengths of light which fall in the yellow to orange spectrum of colors. The reason for the difference appears to reside in the fact that pattern recognition systems depend upon recognition of different gray scale intensities which can be easily detected within the narrow spectrum light sources such as that produced by LEDs. Presently, there are not commercial available LED light sources which have sufficient candle power to be used with commercially available pattern recognition systems of the type used on semiconductor manufacturing equipment such as wire bonders and mask aligners, etc. Such pattern recognition systems precisely locate a dye or a wafer before performing an operational step in the manufacture of the semiconductor part.

Accordingly, it would be desirable to provide a novel illuminator for semiconductor manufacturing equipment which would be particularly suited for use with automatic pattern recognition system equipment.

SUMMARY OF THE INVENTION

It is a principal object of the present invention to provide an apparatus for mounting a plurality of high intensity light emitting diodes (LEDs).

It is another principal object of the present invention to provide a cluster mount for mounting a plurality of LEDs that concentrate and focus the emitted light at a predetermined point.

It is another object of the present invention to provide a cluster mount for plural LEDs that permits the focusing or pre-focusing of individual LEDs.

It is a general object of the present invention to provide a cluster mount for light emitting diodes which concentrates and focuses most of the emitted light on a predetermined spot to provide optimum gray scale intensity values on the surface of the semiconductor device for a pattern recognition system.

According to these and other objects of the present invention there is provided an LED cluster mount having a plurality of LED receivers. The cluster mount is provided with a central axis and each of the LED receivers in the cluster mount is displaced from the central axis and has a focus axis which is focused across the central axis at predetermined distance from said cluster mount. Each receiver is provided with an adjustable sleeve portion and a tape reflector portion which is adapted to concentrate the light emitted from the LEDs at a predetermined spot.

DESCRIPTION OF THE PREFERRED EMBODIMENTS

Figure 1:
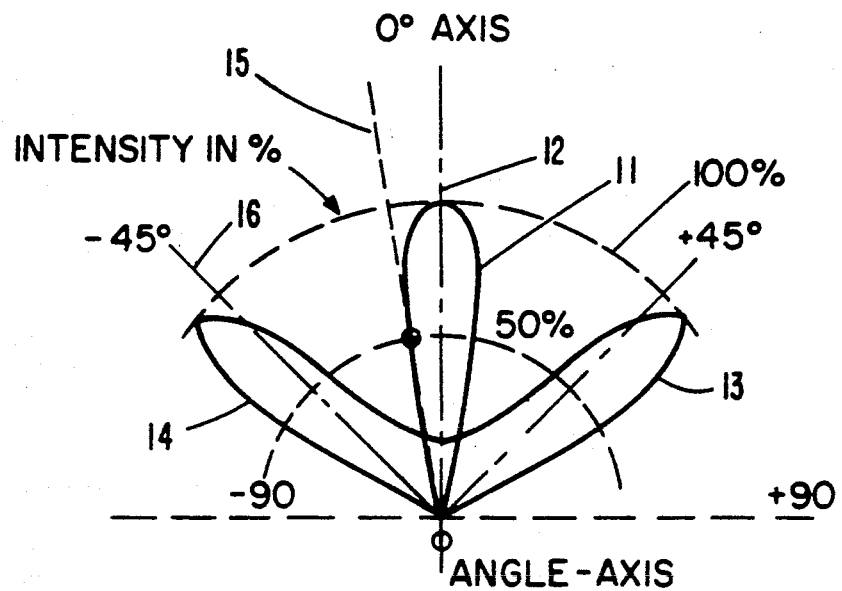
FIG. 1 is a radiation diagram for a high intensity light emitting diode showing frontal and side loads.

Refer now to FIG. 1 showing a typical radiation diagram for commercially available high intensity light emitting diodes. This diagram shows a central or frontal lobe 11 which is symmetrical to the 0° axis 12. The cylindrical coordinates are shown in the percent of intensity versus angle. Thus, the side lobes 13 and 14 are shown emitting light which is directed approximately 45° in the negative and positive cylindrical coordinate directions. The information in FIG. 1 may be interpreted by reference to axis line 15 shown to be approximately 17° from the zero axis and crosses the frontal lobe or beam at the 50° intensity point. Thus, a person looking into the light or lobe along the axis 15 would only encounter 50% of the maximum intensity being emitted along the zero axis as shown in the frontal lobe 11. If the axis is moved in the negative direction closer to the 45° axis 16, the intensity rapidly drops off and then begins to increase as it picks up the side lobe 14. Thus, it will be observed that the intensity of the light is highly dependent on the angle or axis of view looking into the light source.

Figure 2:
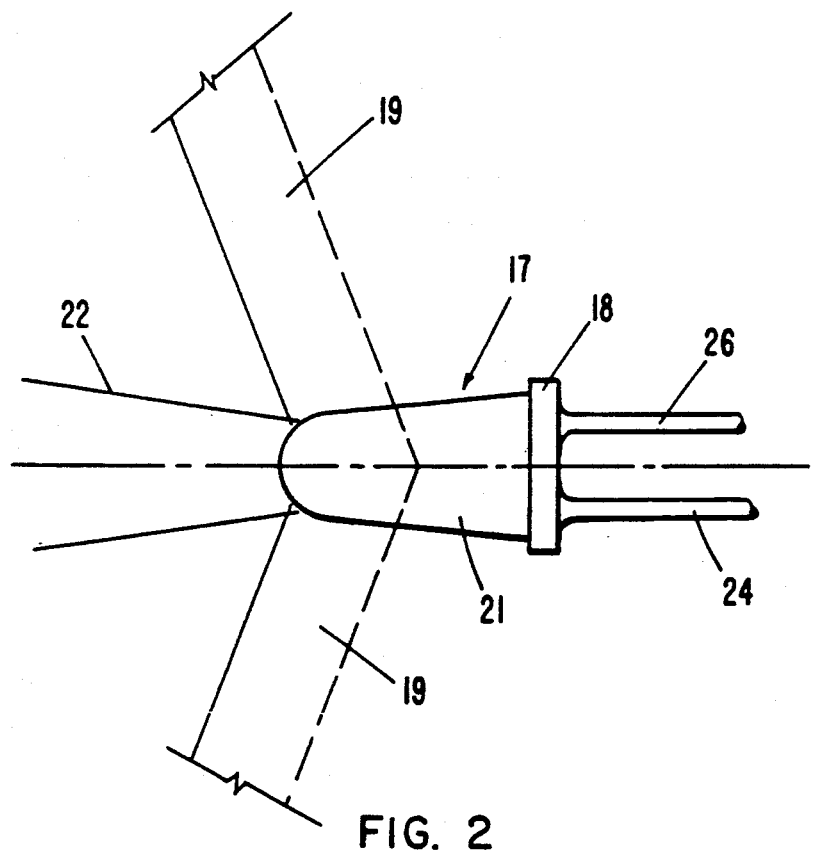
FIG. 2 is an enlarged high intensity light emitting diode showing a frontal cone and an annular ring of light of the type which is generated by commercially available light emitting diodes.

Refer now to FIG. 2 showing an enlarged high intensity light emitting diode 17. The active element of the diode is not shown but the plastic transparent encapsulating cover in the shape of a parabaloid attached to a base 18 is shown for purposes of explaining the LED light source. It has been found that an annular ring of light 19 is emitted from the transparent cover 21 and is substantially parallel and columnated. Further, the frontal cone 22 is found to form a slightly diverging beam of light in the frontal area. This information shown in FIG. 2 does not conflict with the commercially available information shown in FIG. 1 but is more useful in preparing a reflector for concentrating the light being emitted from the LED.

Figure 3:
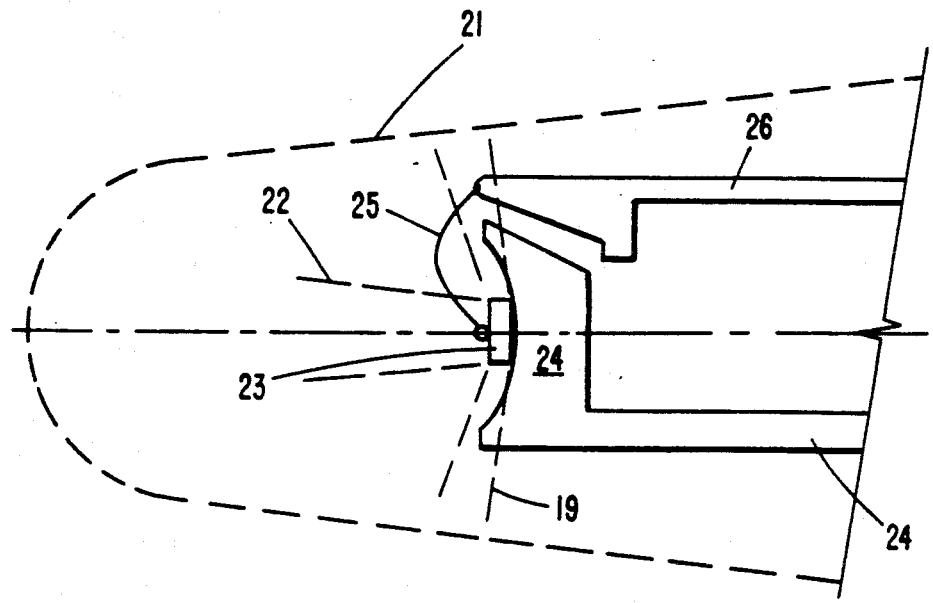
FIG. 3 is an enlarged view of the anode and cathode of a typical stamp lead frame used in the manufacture of light emitting diodes.

Refer now to FIG. 3 showing an enlarged section of the anode and cathode of a typical stamp lead frame used to support a light emitting diode chip 23. The base of the chip 23 is surface mounted in a bold shaped receptacle on the first electrode 24 and prevents back light from being emitted from the chip 23. The annular ring 19 and the frontal cone 22 are shown in dotted lines for purposes of reference to associated FIG. 2. An electrical fine wire 25 is connected to the front face of the chip 23 and electrically connected to the second electrode 26. The electrodes 26 and 24 are shown as leads for connecting the LED 17 to an electrical circuit in both FIGS. 2 and 3.

Figure 4:
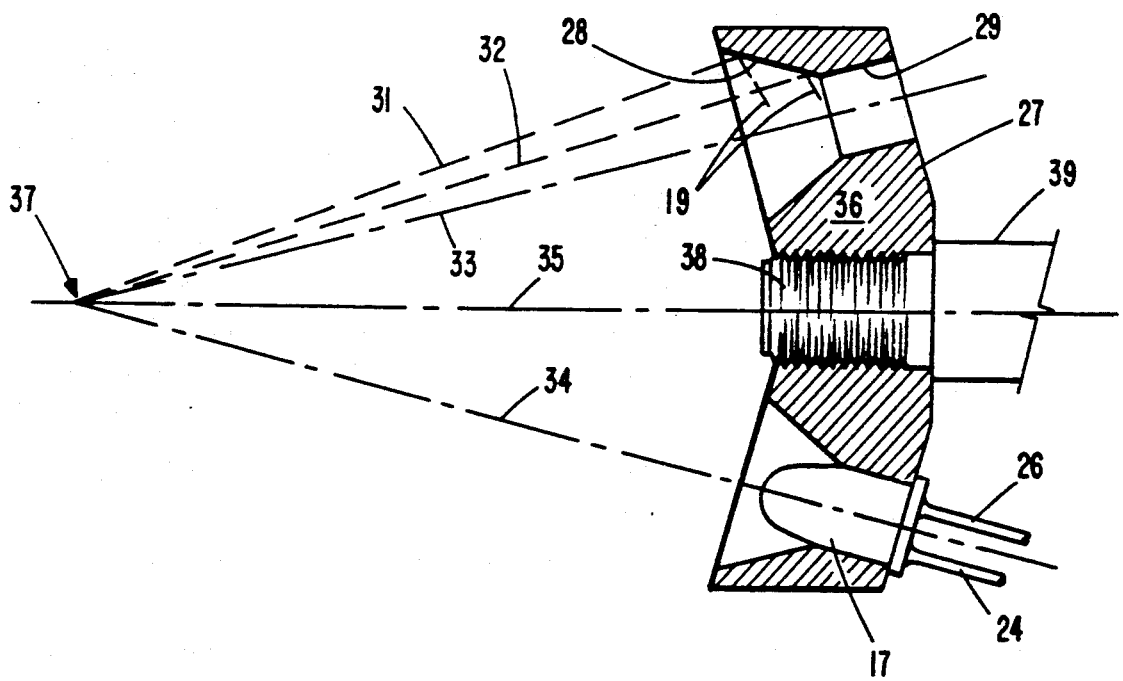
FIG. 4 is a cross-section taken through a preferred embodiment cluster mount showing a removable support.

Refer now to FIG. 4 showing in cross-section a preferred embodiment cluster mount having two or more receivers adapted to mount and pre-focus the light emitted from the light emitting diode 17. The cluster mount 27 may be machined from aluminum or made from a plastic material on which highly reflective cones are provided. The reflective cone area comprises a tapered reflector portion 28 and the adjustable sleeve portion 29 preferably comprises a cylindrical portion. When the cluster mount 27 is originally manufactured, the exact size and dimensions of the LED are known so that the sleeve or receiver portion 29 can be machined to the proper depths so that the aforementioned LED chip 23 is located in the tapered reflector portion at a pre-determined desired position to reflect all of the light being emitted in the form of the aforementioned annular ring 19. Any dispersed light or defused light which is not in the frontal cone 22 will also be refocused along the reflected path shown by dotted lines 31 and 32. Each of the receivers 28, 29 has its own focus axis 33, 34 for each of the LEDs. The focus axis of the LEDs preferably crosses over the central axis 35 of the cluster mount 36. In the preferred embodiment of the present invention the distance from the cluster mount to the area to be illuminated 37 is known and the reflected light from the tapered reflector portion can be focused on this area 37 to provide a complete area or spot of illumination sufficient to completely cover the portion of the chip or wafer being examined by the pattern recognition system. By concentrating several LED sources into a spot or area, the lighted area has been found to be more completely and uniformly eliminated than occurs when using a single point source of light as would occur with a single LED or the prior art light sources. Further, by employing a plurality of LEDs it is sufficient to design the light so that it provides the proper intensity and the required uniformity for optimum for use with pattern recognition systems employing TV cameras. The mount 36 is provided with a commercially available screw 38 which screws into a support bracket 39 used to support the cluster mount 36.

Figure 5:
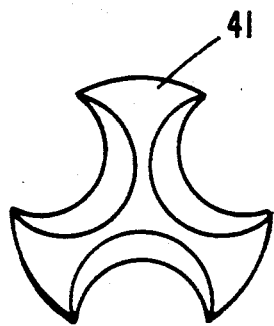
FIG. 5 is a front view of a modified cluster mount adapted to receive a plurality of adjustable pre-focused receivers.
Figure 6:
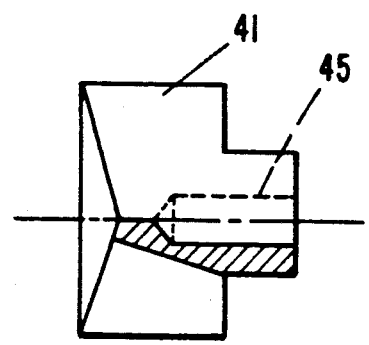
FIG. 6 is a side view and partial section of the cluster mount shown in FIG. 5.
Figure 7:
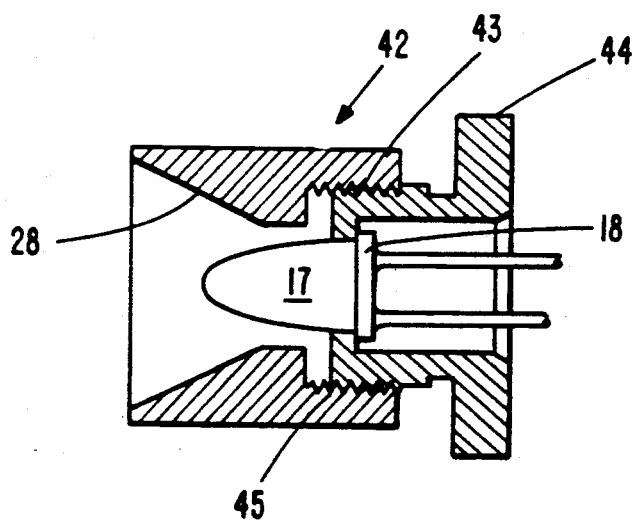
FIG. 7 is an enlarged view in cross-section of one of the adjustable pre-focus receivers of the type used in the cluster mount of FIGS. 5 and 6.

Refer now to FIGS. 5 to 7 showing a modified cluster mount 41 shown in front and side views in FIGS. 5 and 6. The modified cluster mount 41 is designed to receive a plurality of adjustable prefocus receivers 42 of the type shown in FIG. 7. When commercially available LEDs 17 are supplied by different manufacturers, the aforementioned annular ring of light 19 may be occurring at a point measured from the base 18 which differs by employing the receiver 42, it is possible to mount the base 18 in the male threaded portion 43 of the receiver 42 and by adjusting the threaded portion 44 position the annular ring 19 at the optimum position of the highly reflective cone 28. Thus different types of commercially available LEDs 17 may be prefocused in the adjustable receivers 42 and then placed in the modified cluster mount 41 without the requirement for refocusing the LED. It will be understood that the light being emitted from the adjustable receiver 42 basically is a cylindrical columnated light source but slightly diverges due to the frontal cone 22 described hereinbefore. The modified cluster mount 41 is provided with a female threaded portion 45 in the rear of the mount 41 which is employed to mount the cluster mount at a desired distance from the area to be eliminated described hereinbefore.

Having explained a cluster mount which may be machined from a metal which may be polished to a high reflective surface, it will be understood that the same mount may be made from other metals or plastic and a highly reflective tapered reflector portion added. Such tapered reflector portions may be made in the form of a truncated cone or parabaloidical or empirically designed to obtain the properly desired focus of the reflected beam.

It will be further understood that the adjustable prefocus receivers 42 of the type shown in FIG. 7 may be further modified by eliminating the male portion 43 of the receiver and supplying spacing rings and mounting rings for the LED 17 so as to obtain the proper position of the LED chip relative to the highly reflective tapered portion 28.

It has been found that light emitting diodes having wave lengths which fall in the color spectrum between yellow and light red provide the proper color and intensity for optimum gray scale intensity illumination of semiconductor dye and wafers for use with pattern recognition systems. However, since the preferred embodiment cluster mounts may employ more than two and up to six individual LEDs it is possible to mix the color spectrum of the LEDs to achieve a broader range of wave lengths for some specific applications.

What is claimed is:

1. A light emitting diode cluster mount for concentrating light being emitted from super bright light emitting diode chips that are bonded to a base electrode and encapsulated in a transparent carrier, comprising:

a cluster mount having a plurality of diode receivers therein, said cluster mount having a central axis and each of said diode receivers having a focus axis displaced from said central axis and focused to cross said central axis at predetermined distance from said cluster mount, said diode receivers each comprising an adjustable sleeve portion and a tapered reflector portion, means for positioning said light emitting diode chips at a position adjacent said tapered reflector portion so that the light emitting from the sides of each diode semiconductor is reflected and refocused along its focus axis, and support means extending from the rear of said mount for attaching said cluster mount to a support structure.

2. A light emitting diode cluster mount as set forth in claim 1 wherein said tapered reflector portion of said diode receivers each comprises a truncated cone.

3. A light emitting diode cluster mount as set forth in claim 2 wherein said truncated cone is provided with an included angle between 50° and 75°.

4. A light emitting diode cluster mount as set forth in claim 2 which includes super bright light emitting diodes of the type which emit an annular ring of side light and wherein where said truncated cone is deeper than the width of said annular ring of side light.

5. A light emitting diode cluster mount as set forth in claim 1 wherein said diode receivers comprise an adjustable sleeve portion which is provided with a male threaded end portion and said tapered reflector portion is provided with a female threaded end portion so that said diodes semiconductor is adjustably located along the focal axis relative to said tapered reflector portion.

6. A light emitting diode cluster mount as set froth in claim 5 wherein said adjustable sleeve portion is provided with an internal flange stop adapted to position a light emitting diode therein.

7. A light concentrating mount for super bright light emitting diodes said super bright light emitting diodes each being of the type having a semiconductor chip bonded to a base electrode and encapsulated in a transparent carrier comprising:
- a cluster mount having a plurality of apertures therein,
- each said aperture having a reflector portion and a cylindrical recess position adapted to adjustably receive a light emitting diode so that the diode semiconductor chip in the transparent carrier extends into and is adjacent to the reflector portion, and
- each said reflector portion having a tapered side wall adapted to reflect and converge all of the light being emitted directly from the sides each of said diode semi-conductor chip, and to refocus and converge the reflected light along the focus axis of each said light emitting diode onto a central small area.

* * * * *